United States Patent
Bautista et al.

(10) Patent No.: US 9,500,672 B1
(45) Date of Patent: Nov. 22, 2016

(54) METER SOCKET ADAPTOR

(71) Applicant: SolarCity Corporation, San Mateo, CA (US)

(72) Inventors: Garret Bautista, San Rafael, CA (US); Cormac McHugh, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/941,411

(22) Filed: Nov. 13, 2015

Related U.S. Application Data

(60) Provisional application No. 62/155,291, filed on Apr. 30, 2015.

(51) Int. Cl.
*H01R 33/945* (2006.01)
*G01R 1/04* (2006.01)
*H01R 31/06* (2006.01)

(52) U.S. Cl.
CPC ............. *G01R 1/0416* (2013.01); *H01R 31/06* (2013.01)

(58) Field of Classification Search
CPC ................ G01R 1/0416; H01R 31/06
USPC ........................................... 439/517
See application file for complete search history.

(56) References Cited

U.S. PATENT DOCUMENTS

| 7,648,389 B1 * | 1/2010 | Scott | H01R 9/2491 439/517 |
| 8,784,130 B2 * | 7/2014 | Scott | H01R 33/945 439/517 |

* cited by examiner

*Primary Examiner* — Javaid Nasri
(74) *Attorney, Agent, or Firm* — Kilpatrick Townsend & Stockton LLP

(57) ABSTRACT

This disclosure pertains to methods and apparatus for interfacing an onsite power generation system with an existing main electric panel. The interfacing is performed by: attaching an additional jaw connector to a neutral bridge within an existing meter socket; wiring AC supply lines from the onsite power generation system to load side jaws of a five blade meter socket adapter; and wiring a neutral line from the onsite power generation system to an additional terminal of the meter socket adapter. The lines from the onsite power generation system are routed through an opening formed in the meter socket adapter. The meter socket adapter is then inserted into the meter socket so that five jaws in the socket receive all five blades of the meter socket adapter. The blades of the meter are then plugged into the jaws on the opposite end of the meter socket adapter.

18 Claims, 8 Drawing Sheets

METER SOCKET ADAPTOR

CROSS-REFERENCES TO RELATED APPLICATIONS

This application claims the benefit of priority under 35 U.S.C. §119(e) to U.S. Provisional Application No. 62/155,291, filed on Apr. 30, 2015, which is incorporated herein by reference in its entirety.

FIELD OF THE INVENTION

The invention relates generally to power generation and more specifically to the electrical interface between onsite power generation systems and existing grid-based commercial and/or residential power distribution systems.

BACKGROUND OF THE INVENTION

Onsite power generation has become increasingly popular. For decades now, particularly in areas that are prone to power outages and/or for businesses that require uninterrupted power, oil and diesel backup power systems have been used to generate onsite power when the grid is unavailable. These systems generate alternating current (AC) power that ties into a customer's existing power distribution system, typically on the load side (i.e., between the utility meter and the main panel) or directly into the main customer panel. More recently, continuous onsite generation based on alternative energy sources has increased in popularity.

Like back-up power systems, onsite alternative energy generating systems are frequently retrofit into existing structures which may have electrical systems that are not by default setup to accept additional energy inputs. One solution to this has been to wire directly to the bus bars of the customer's main electrical panel. However, this solution is not ideal because current national electric code limits the amount of current that can be delivered to the bus bars to 20 percent of the main breaker's capacity. So this in turn will limit the maximum capacity of an onsite power generation system connected in this way.

To deal with this problem, installers of onsite power generation systems frequently have to upgrade the customer's main electrical panel so that it has enough excess current capacity on the bus bars to accommodate the desired generation system. Then the power from the onsite generation system can be fed directly into the main panel and either power the home or business or back feed power to the grid.

Another solution to interfacing to existing grid power at the customer premises has been to utilize a so-called meter socket adapter or MSA. The MSA fits in between the meter socket in the customer's existing main panel and the utility company's meter. Usually the MSA has an opening or input collar to receive the AC output of an onsite power generation system. This is preferable to upgrading the main panel because it requires very little labor and is not affected by the current limitations of the bus bars in the customer's existing main electrical panel. Two such MSAs are disclosed in commonly assigned U.S. Pat. Nos. 8,784,130 and 7,648,389, the disclosures of which are hereby incorporated by reference in their entirety.

In a typical residential or commercial (e.g., 120V/240V) system, the meter itself has only two inputs and two outputs—it does not use the neutral wiring coming in from the utility or flowing out to the customer's main electrical panel—yet the onsite power generation system typically has two AC lines plus a neutral wire. As a result, when interfacing an onsite power generation system to a customer's electrical panel with an MSA, such as that disclosed in U.S. Pat. Nos. 8,784,130 and 7,648,389, the neutral wire has to be run through the MSA, typically through a built in aperture, so that the loose end can be spliced with the grid neutral running through the meter socket. This is less than optimal. First, it requires additional manual wiring to the neutral through the adapter so that the unconnected adapter is dangling while the neutral is being wired. Second, after the wiring has been completed and the adapter connected to the socket, if at any point the adapter has to be removed, simply pulling it out won't disconnect it from the meter socket in the electrical panel because the neutral wire will remain connected and must be manually disconnected.

Therefore, there exists a need for a mechanism for interfacing an onsite power generation system to a customer's power distribution system that ameliorates the shortcomings of conventional solutions.

SUMMARY OF THE INVENTION

This disclosure describes various embodiments that relate to methods and apparatus for efficiently tying an onsite power generation system, such as a photovoltaic energy source, into an existing electrical panel.

A meter socket adapter for interfacing an onsite power generation system with an electrical service panel is disclosed. The meter socket adapter includes the following: a cylindrical body having a first end and a second end; an opening defined by a lateral wall of the cylindrical body; a set of four blade connectors on the first end of the cylindrical body positioned to connect to four jaw connectors in a meter socket of the electrical service panel, wherein two of the blade connectors are electrically coupled to supply terminals for wiring two respective AC supply lines from the onsite power generation system entering the meter socket adapter by way of the opening; a corresponding set of four jaw connectors disposed on the second end of the cylindrical body, electrically coupled to the respective four blade connectors on the first end and positioned to mate with four additional blade connectors of a utility meter; a neutral terminal for attaching a neutral wire from the onsite power generation system; and a fifth blade connector electrically coupled to the terminal and disposed on the first end of the cylindrical body for electrically coupling the neutral wire of the onsite power generation system to a neutral jaw connector in the meter socket at the same time that the four blade connectors mate with the four jaw connectors in the meter socket.

In many embodiments, the onsite power generation system takes the form of a photovoltaic array.

In many embodiments, the two AC supply lines include AC phase 1 and AC phase 2 respectively.

In many embodiments, the four blade connectors of the meter socket adapter are arranged in a symmetric configuration.

In many embodiments, the fifth blade connector is arranged orthogonally with respect to the set of four blade connectors.

In many embodiments, the cylindrical body defines multiple openings configured to accommodate the fifth blade connector.

In many embodiments, the first end of the cylindrical body has a size and shape in accordance with the standard meter socket.

A method of interfacing an onsite power generation system to an existing electrical service panel with a meter socket adapter is disclosed. The method includes taking the following actions: removing a utility meter from a meter socket of the existing electrical service panel to expose a meter socket; electrically coupling a fifth jaw connector to a neutral wire terminal inside the meter socket; connecting at least two AC power supply lines from an onsite power generation system to respective first and second load side terminals of the meter socket adapter via an opening in a side wall of the meter socket adapter; connecting a neutral wire from the onsite power generation system to a neutral terminal in the meter socket adapter by way of the opening in the side wall of the meter socket adapter, the neutral terminal being electrically connected to a neutral blade connector of the meter socket adapter; plugging a first side of the meter socket adapter into the meter socket so that first and second supply side blade connectors of the meter socket adapter are connected to respective first and second supply side jaw connectors of the meter socket, and first and second load side blade connectors of the meter socket adapter are connected to respective first and second load side jaw connectors of the meter socket, and the neutral blade connector is connected to the fifth jaw connector; and connecting the utility meter to an opening in a second side of the meter socket adapter.

In many embodiments, the onsite power generation system is a photovoltaic array.

In many embodiments, the at least two AC supply lines include AC phase 1 and AC phase 2 respectively.

In many embodiments, the fifth jaw connector is oriented orthogonally with respect to each of the first and second supply side jaw connectors and first and second load side jaw connectors.

In many embodiments, the fifth blade connector is orthogonal to each of the first, second, third, and fourth blade connectors on the first end of the cylindrical body.

In many embodiments, connecting the utility meter to an opening in a second side of the meter socket adapter includes engaging blade connectors of the meter with jaw connectors arranged along the second side of the meter socket adapter.

In accordance with other embodiments, a meter socket adapter includes the following: a cylindrical housing that includes a first wall defining connector openings, the first wall including a first surface arranged along an exterior of the cylindrical housing and a second surface defining an interior volume of the cylindrical housing, and a second wall having a curved geometry and defining a wiring port; multiple connectors extending through the connector openings defined by the first wall of the cylindrical housing, each of the connectors including: a blade connector protruding from the first surface, and a jaw connector protruding from the second surface; and multiple terminals positioned within the interior volume and being configured to connect wires passing through the wiring port to corresponding ones of the connectors. One of the terminals is configured to connect to a neutral wire.

In many embodiments, the meter socket adapter includes clips that keep corresponding connectors secured within the connector openings.

In many embodiments, there are at least five connectors.

In many embodiments, the jaw connectors are configured to be coupled with blade connectors of an electric meter.

In many embodiments, the blade connectors protruding from the first surface are configured to be coupled with jaw connectors of a meter socket of an electrical panel.

In many embodiments, the first wall of the cylindrical housing defines two openings for accommodating a connector configured to engage a neutral jaw connector in the meter socket and moving the connector between the two openings allows the meter socket adapter to be installed in the meter socket in two different orientations.

In many embodiments, one of the connectors is configured to be coupled with a jaw adapter installed within a meter socket of an electrical panel.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

In order to facilitate a better understanding of the present disclosure, reference is now made to the accompanying drawings, in which like elements are referenced with like numerals. These drawings should not be construed as limiting the present disclosure, but are intended to be exemplary only.

DETAILED DESCRIPTION

The following description is intended to convey a thorough understanding of embodiments described by providing a number of specific embodiments and details involving interfacing a photovoltaic system to an existing main electric panel. It should be appreciated, however, that the present invention is not limited to these specific embodiments and details, which are exemplary only. Other types of energy collecting systems could interface an existing main electrical panel in the ways described herein. For example, both a wind powered turbine or a generator-based onsite power generation systems could interface with an electrical panel in the ways described in this disclosure. It is further understood that one possessing ordinary skill in the art, in light of known systems and methods, would appreciate the use of the invention for its intended purposes and benefits in any number of alternative embodiments, depending upon specific design and other needs.

As noted above, there is a need for an inexpensive, quick, yet safe way to interface onsite power generation systems to existing customer premises' power distribution systems (e.g., utility meter and main electrical panel). Various embodiments of the invention accomplish this with a meter socket adapter that includes a fifth jaw/blade connector in the adapter. In various embodiments, the fifth jaw/blade may be used as a terminal for attaching the neutral wire coming from the onsite power generation system (e.g., central inverter output). Various embodiments may utilize a jaw adapter kit wired to the gird neutral wire entering the socket in the existing meter as a terminal for engaging with the fifth blade on the meter socket side (e.g., back side) of the meter socket adapter. In some embodiments, the jaw adapter kit can be installed on a neutral bridge within the meter socket. These and other embodiments are discussed in greater detail in the paragraphs that follows.

Figure 1:
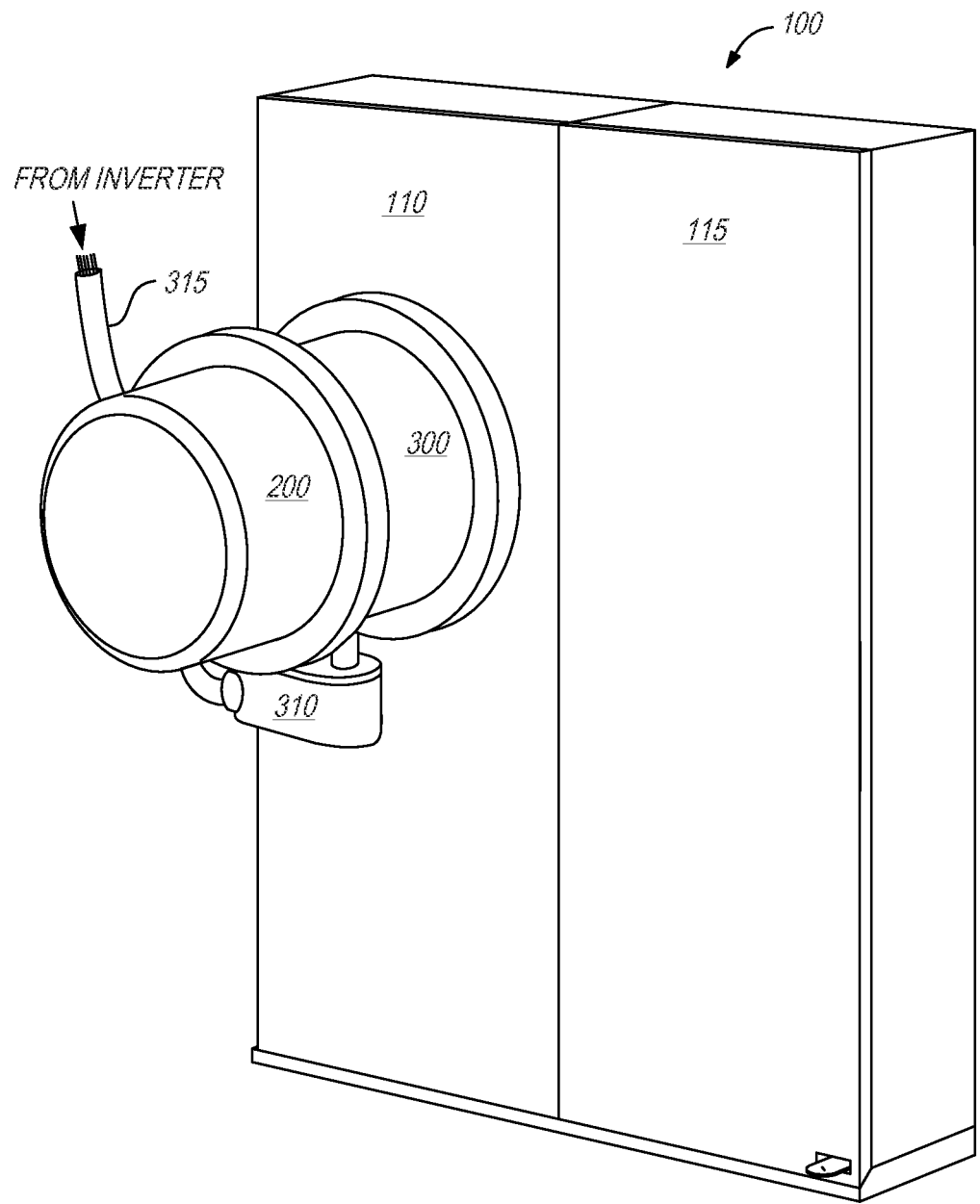
FIG. 1 is a perspective view of a conventional main electrical panel including a utility meter and a meter socket adapter, according to various embodiments of the invention.

Referring now to FIG. 1, this figure shows electrical panel 100 that includes utility side 110 and customer side 115. Typically the main breaker and specific circuit breakers are located on customer side 115 while the incoming utility powerlines, electrical meter 200 and meter socket 300 are located on utility side 110. In the system illustrated in FIG. 1, depicted meter socket adapter 300 could be a meter socket adapter according to various embodiments of the invention. Meter socket adapter 300 includes input connector 310 and section of conduit 315 that carries the conductors from an onsite power generation system. In some embodiments, the onsite power generation system is a photovoltaic system that utilizes a so-called "string" or central inverter. Alternatively, the photovoltaic system could utilize micro-inverters—miniature inverters connected to the output of each photovoltaic module or N modules—in which case a string inverter would not be needed. Either way, conduit 315 and connector 310 would contain wires carrying AC power. In various embodiments, this includes phase 1 and phase 2 120 volt or 240 volt AC power as well as neutral and ground wires.

It should be appreciated that the invention is not limited to interfacing a photovoltaic system. Various embodiments of the invention may be usable with a wind turbine or other onsite power generation system. The specific type of onsite power generation system is not critical to the various embodiments of the invention.

In the system shown in FIG. 1, and as will be discussed in greater detail in reference to the remaining figures, in various embodiments, meter socket adapter 300 is connected to a meter socket on utility meter side 110 of electrical panel 100 by simply pulling out electrical meter 200, adding a fifth connector within the meter socket, plugging in meter socket adapter 300 in its place, and plugging electrical meter 200 into meter socket adapter 300.

Figure 2:
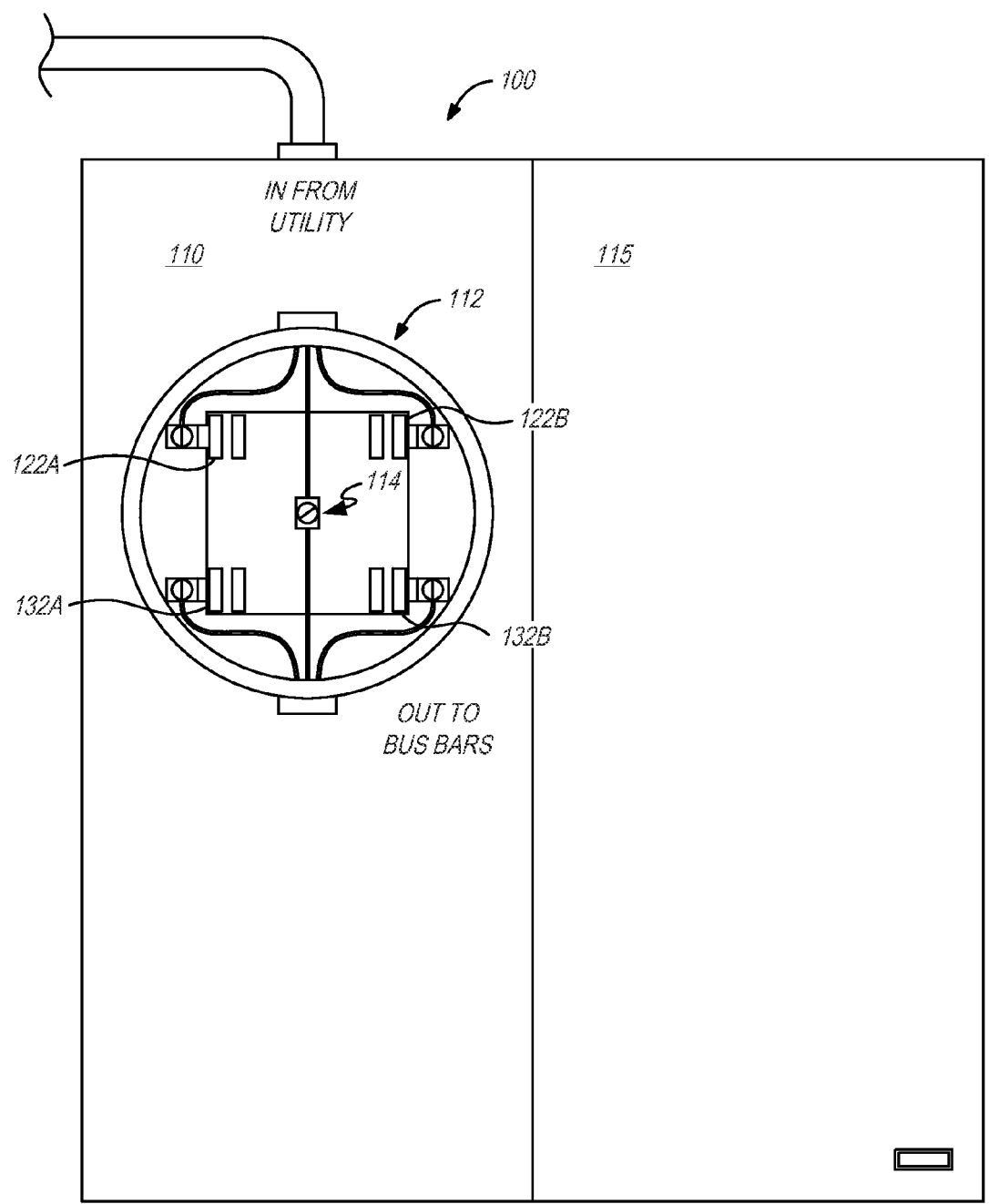
FIG. 2 is a front view of a conventional electrical panel showing internal wiring and jaw connectors of the panel's meter socket.

Turning now to FIG. 2, this figure shows the internals of a conventional meter socket 112 in a standard electrical panel 100. Utility wires carrying 120V power (phase 1 AC, phase 2 AC, neutral and ground wires) typically enter the box either from the top, bottom or side, of the enclosure where they terminate at respective connectors so that incoming power can be metered. Typically, the two live wires will be connected in some fashion to respective terminals on jaws 122A, and 122B. Jaw connectors are preferred for this application because they allow a worker to insert a meter or meter socket adapter with reciprocal blade connectors that are co-located with the jaws and dimensioned to fit snugly between them, without having to actually touch the wires.

Because the neutral wire is not connected to the meter in most applications, the neutral wire from the utility simply terminates at a connector within meter socket 112, such as terminal 114 shown in the center of meter socket 112. In this way, the neutral from the grid can be spliced with the neutral going to customer side 115 of electrical panel 100. The ground wire is typically wired to a terminal within meter socket 112. Because the ground wire is securely coupled to a terminal within the meter socket, the meter socket adapter cannot be removed without first removing the ground wire from the terminal.

As also shown in FIG. 2, jaws 130A and 130B are wired to respective conductors running out to the bus bars on customer side 115 of electrical panel 100. This wiring is usually concealed within the body of electrical panel 100 and may come pre-wired to the bus bars by the panel manufacturer. As clearly seen in FIG. 2, by inserting a meter, such as electrical meter 200 shown in FIG. 1, or meter socket adapter 300 and electrical meter 200, the connection between jaws 122A and 132A and the connection between jaws 122B and 132B are completed, allowing power to flow to customer side 115 of electrical panel 100 while also allowing the utility to monitor the amount of power that flows, typically measured in units of kilowatt hours or kWh. Also, though not shown in FIG. 1 or 2, customer side 115 of electrical panel 100 typically has a hinged door that allows access to the breakers and bus bars inside.

Figure 3A:
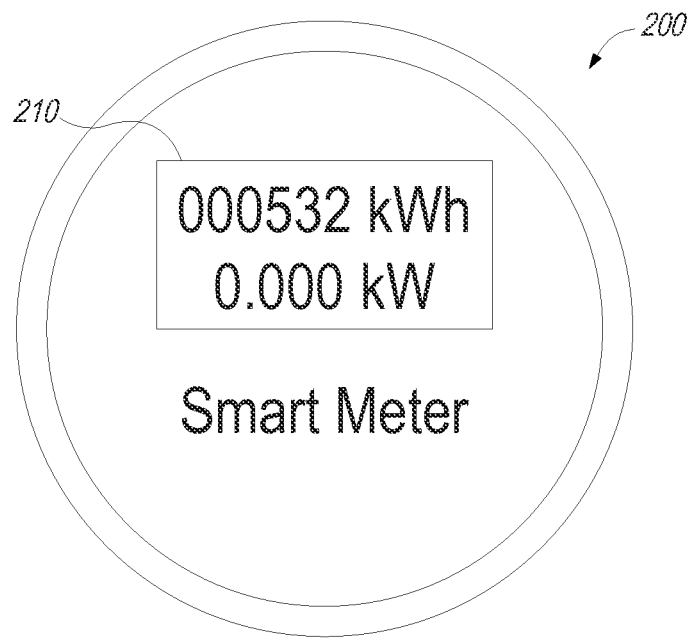
FIGS. 3A and 3B respectively show a front view and a rear view of a conventional digital utility meter.
Figure 3B:
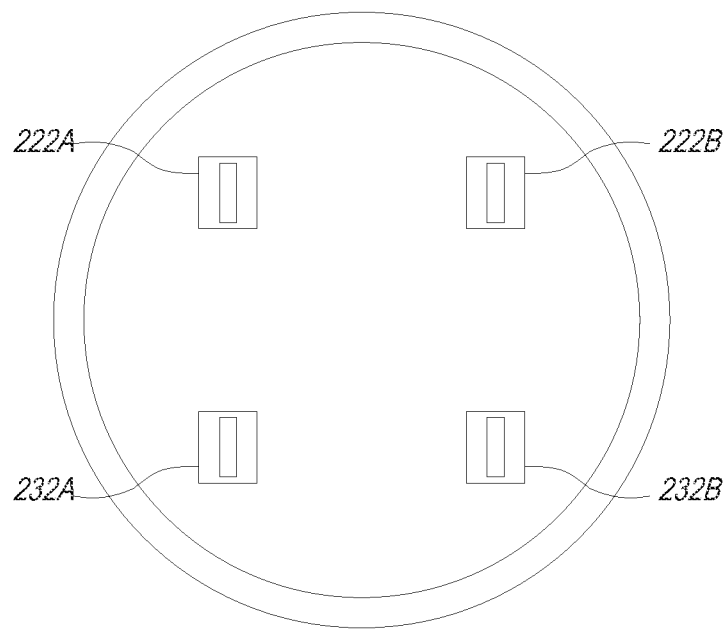

Turning now to FIGS. 3A and 3B, these figures show front and back views, respectively, of electrical meter 200. The front face of electrical meter 200 typically includes a display such as digital display 210, illustrating information such as the kilowatt hours consumed to date and a current number of kilowatts being drawn through meter 200. Older meters may have a series of dials counting the kilowatt-hours to date and a spinning wheel that indicates the rate of current consumption. The various embodiments of the invention are compatible with either solution.

FIG. 3B shows the backside of electrical meter 200. Whether analog or digital, conventional meters typically utilize 4 blade connectors to bridge the left and right hot wires in the meter socket of the main electrical service box. For example, blades 222A and 232A are interconnected through the meter and blades 222B and 232B are also connected through the meter. The position of these blades is standardized so that meters manufactured by multiple suppliers will fit with a number of different main panels.

In some embodiments, electrical meter 200 is pushed into the socket so that the blades are held captive by the jaws inside the meter socket with a friction fit. Sometimes there is a pair of loops—one outside the socket and one on the meter itself—that enables a small lock or other device to be applied that secures electrical meter 200 within meter socket 112. In this way, unauthorized access to the meter can be prevented, thereby preventing energy from being siphoned off ahead of the meter.

Figures 4A, 4B:
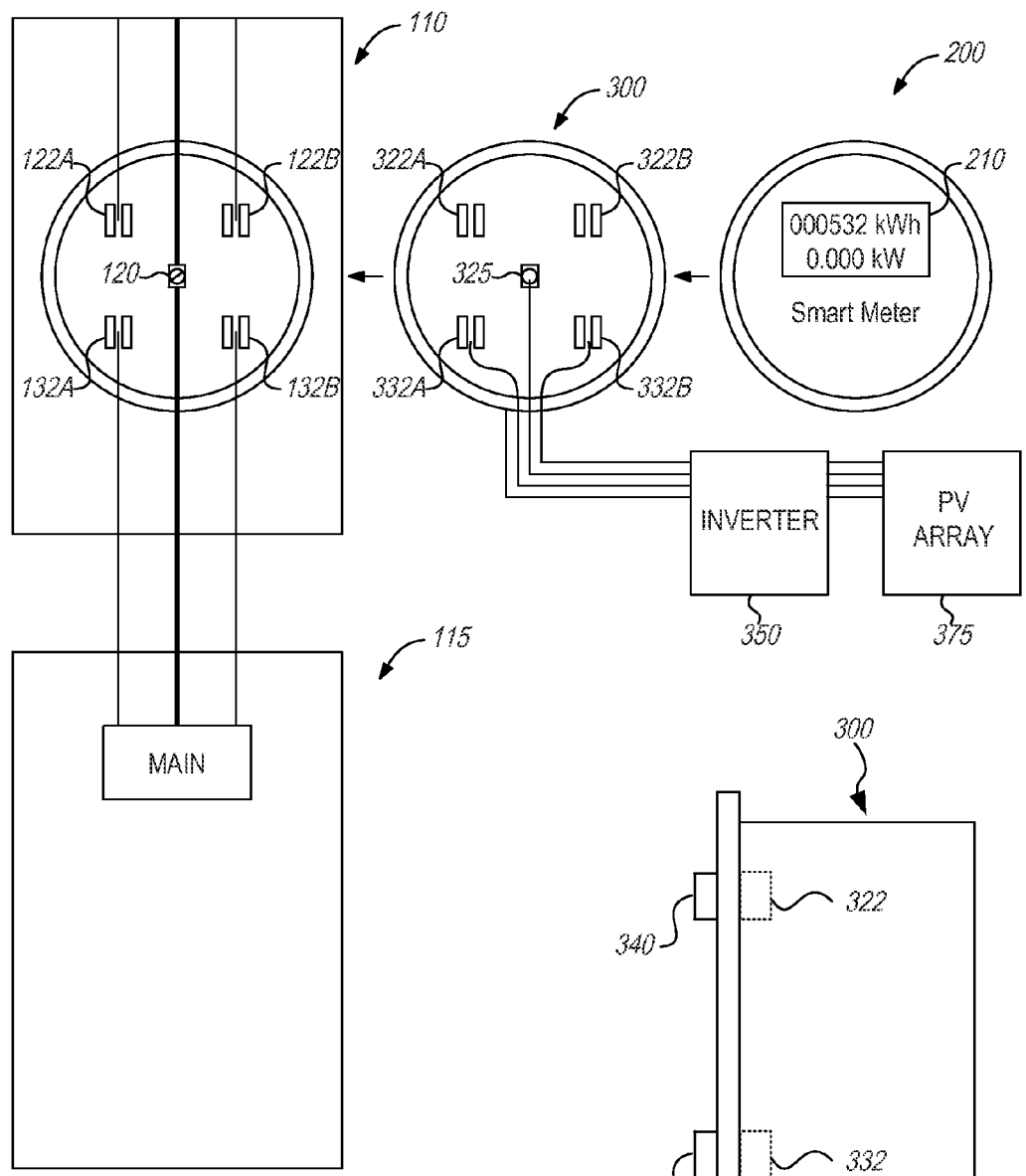
FIG. 4A is a system diagram showing components of a conventional photovoltaic power generation system and a meter socket adapter interface to main electrical panel at a customer premises.
FIG. 4B is a side view of the conventional meter socket adapter shown in FIG. 4A.

Referring now to FIG. 4A, this figure shows components of a PV system utilizing a conventional meter socket adapter. Onsite energy generation starts with PV array 375 including one or more photovoltaic modules installed in an array (e.g., on a residential or commercial rooftop, a fixed ground mount, a sun tracker, etc.). In many cases, the arrays' positive and negative direct current (DC) output will be combined into two lines that run to a central or string inverter such as inverter 350. Alternatively, the modules may be equipped with one or more micro inverters that perform DC to AC conversion at the module level or N module levels so that the power coming out of the array is already AC, obviating the need for a central inverter. In such cases there will be four lines coming directly from the array (AC phase 1, AC phase 2, neutral and ground).

Typically, though not necessarily, the inverter will be located near the premises' main electrical service box. As shown in FIG. 4A, the output of the inverter is wired to meter socket adapter 300, with AC phase 1 and AC phase 2 being connected to load side jaw connectors 332A and 332B. Jaw connector 322A and 322B are operative to pass current entering from jaws 122A and 122B to electrical meter 200. In such a conventional system, the neutral wire simply passes through meter socket adapter 300, such as by way of opening 325, and needs to be wired to a fixed terminal inside the opening of meter socket 112, such as terminal 114 prior to the meter socket adapter being installed. Subsequent to securing the neutral wire to the fixed terminal, the blades on the backside of meter socket adapter 300 can be mated with corresponding jaws 122A, 122B, 132A, and 132B. Then, electrical meter 200 can be plugged into adapter 300 to complete the installation. It should be appreciated that some jurisdictions may require a separate shut off box between the inverter's output/array output and electrical panel 100.

FIG. 4B is a side view of conventional meter socket adapter 300 shown in FIG. 4A. Four corresponding blade connectors 340 protrude from the rear of adapter 300 to mate with corresponding jaws 122A, 122B, 132A, and 132B of meter socket 112. Typically, though not necessarily, each blade and jaw pair in the meter socket adapter is a single two-sided connector with a blade on one side and a jaw on the other side. However, some systems may utilize two-piece connectors that connect through the socket adapter.

Figure 5A:
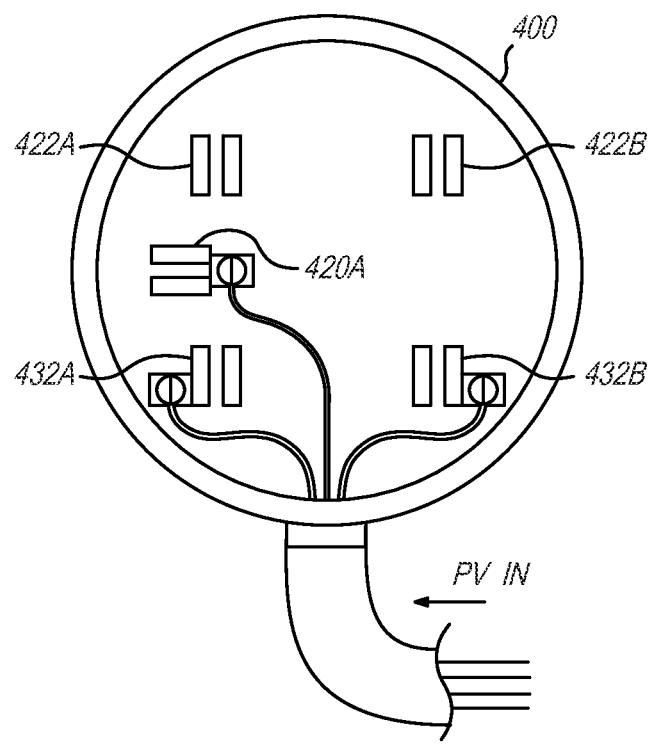
FIGS. 5A-5B respectively show front and rear views of a meter socket adapter according to various embodiments of the invention.

FIG. 5A shows a meter socket adapter according to various embodiments of the invention. Socket adapter 400 of FIG. 5A is illustrated connected to a central inverter-based PV system. Incoming phase 1 and phase 2 AC lines are connected to respective jaw terminals 432A and 432B, while jaw terminals 422A and 422B are both open, serving only to route power from the incoming AC utility lines to the meter. Terminals 432A and 432B are preferably positioned on the load side of the meter so that power flowing into them from the PV system can back feed power to the utility through the utility meter. In addition, fifth jaw connector 420A has been added to the socket adapter 400. Fifth connector 420A is used to provide a wired interface to the third (neutral) line coming from the PV system. In various embodiments, this fifth connector may be oriented orthogonally to the other connectors (i.e., rotated by 90 degrees). This improves clearance with respect to the other terminals. As will be discussed in greater detail with reference to the remaining figures, having fifth connector 420A advantageously allows the PV system to be integrated on the load side of the meter such that pulling adapter 400 from meter socket 112 completely disconnects the PV system from utility side 110 of electrical panel 100, without any further need for disconnection of any grounding or neutral wires.

Figure 5B:
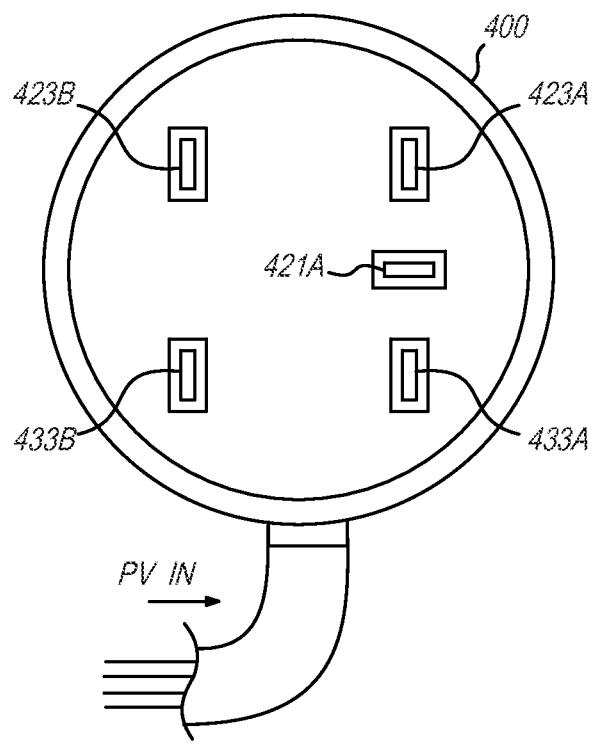

FIG. 5B shows the backside of meter socket adapter 400—the side that plugs into meter socket 112 in the main panel. Like conventional meter socket adapters, meter socket adapter 400 has four blade connectors 423A, 423B, 433A, and 433B that are electrically coupled to the four jaws on the front side for interfacing the jaws in the adapter to the blades on the back of a conventional meter. In addition, meter socket adapter 400 has a fifth blade 421A that is electrically connected to connector 420A which in turn is connected to the neutral wire coming from the onsite power generation source—in this case a PV array. It should be appreciated that fifth jaw 420A is optional. All that is needed is a terminal on the front side to which the neutral wire incoming from the onsite power generation system can be attached. Jaw 420A on the front side of meter socket adapter 400 is not utilized by the utility meter. A screw terminal or other connector will suffice as long as it is electrically connected to blade 421A.

Also, although not shown in the figures, it is possible that the wires from the onsite power generation system may enter meter socket adapter 400 so that they are wired to the blade connectors on the back side of the meter socket adapter, rather than the jaws on the front side, so long as the AC phase 1 and AC phase 2 are connected to the load-side blades (i.e., the ones corresponding to the adapter jaws that receive the output of the utility meter when the meter is connected to the adapter). Also, although not illustrated, the ground wire coming from the onsite power generation system would typically be wired to a conductive terminal built into meter socket adapter 400.

Figure 5C:
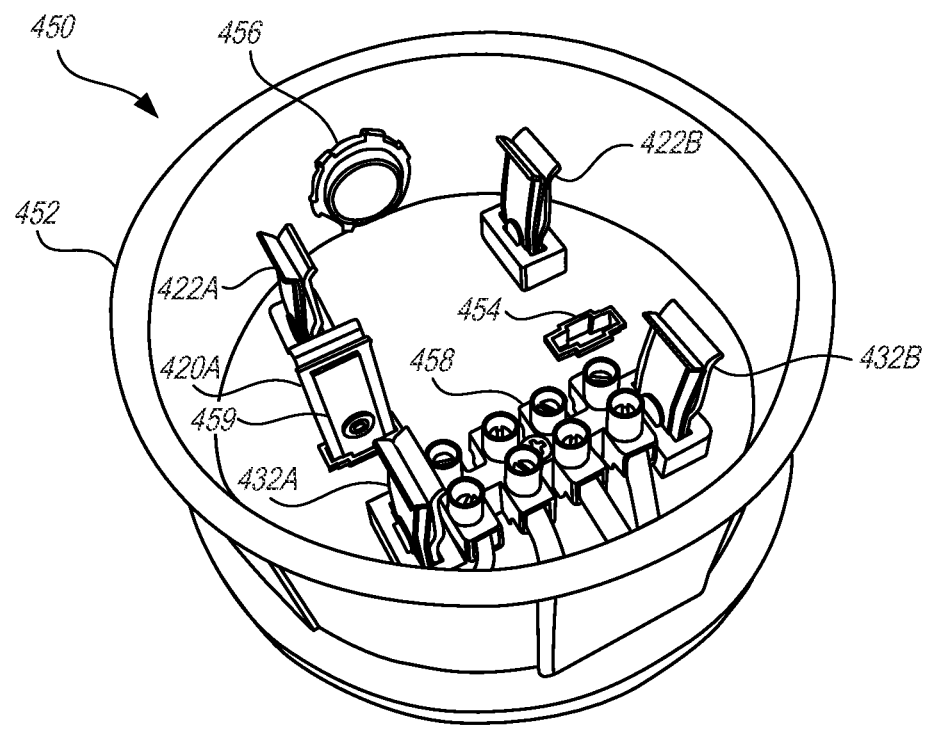
FIGS. 5C-5D respectively show front and rear perspective views of a meter socket adapter according to various embodiments of the invention.
Figure 5D:
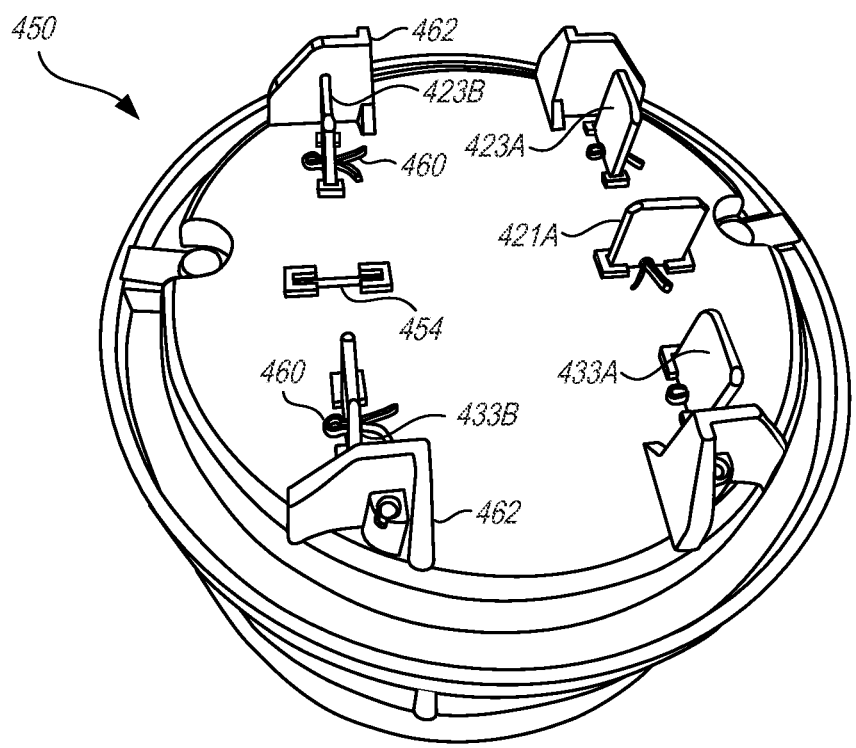

FIGS. 5C and 5D show perspective views of exemplary embodiments of meter socket adapter 450, which are similar to meter socket adapter 400. FIG. 5C shows an interior portion of meter socket adapter 450 defined by meter socket adapter housing 452. Meter socket adapter housing 452 can be formed of electrically insulating material, such as a polymeric material, and can have a substantially cylindrical geometry. One end of the cylinder shape of meter socket adapter housing 452 is open so that electrical meter 200 can be accepted therethrough. FIG. 5C also shows jaw terminals 420A, 422A, 422B, 432A and 432B which are all disposed within openings defined by meter socket adapter housing 452 and designed to interface with blade connector terminals of electrical meter 200. It should be noted that in some embodiments, electrical meter 200 can include a fifth blade connector terminal to interface with jaw terminal 420A in order to provide a neutral and/or grounding pathway for electrical meter 200. Meter socket adapter housing 452 can also include a jaw terminal opening 454 that is sized to receive jaw terminal 420A. This additional opening can allow meter socket adapter 450 to be reversed with respect to its orientation when engaging meter socket 112 by moving jaw terminal 420A to jaw terminal opening 454. In this way, a location of wiring port 456 with respect to an electrical panel can be shifted 180 degrees. Alternatively, two such wiring ports positioned diagonally from one another may be included in housing 452 to allow for either configuration. The unused wiring port can be capped with an appropriate capping mechanism.

Wiring port 456 is configured to receive wires associated with wiring connector 310 (see FIG. 1). Wires entering meter socket adapter housing 452 through wiring port 456 can be electrically coupled to electrical terminal 458. Electrical terminal 458 includes four ports configured to receive each of the wires associated with wiring connector 310, namely, positive, negative, neutral and ground wires. The depicted wires exiting electrical terminal 458 conduct current from the wires to corresponding jaw terminals 432A, 432B and 420A. Jaw terminals 422A and 422B don't need to be coupled as they operate as a simple pass through that conducts supply side power back and forth between the panel and the meter. It should be noted that the depicted jaw connectors can also include stiffening elements bolted to one or more sides of the jaw connectors. For example, jaw connector 420A includes stiffener 459 bolted to an exterior facing surface of jaw connector 420A. Stiffener 459 can be adjusted to increase an amount of force with which jaw connector 420A grabs onto a corresponding blade connector.

FIG. 5D shows an exterior surface of meter socket adapter 450. In particular, each of blade connectors 423A, 423B, 433B, 433A and 421A are depicted. These blade connectors are configured to engage jaw connectors disposed within meter socket 112. FIG. 5D also depicts clips 460 that are configured to secure each of the blade connectors to meter socket adapter housing 452. Clips 460 secure each of the blade connectors by being inserted through an opening in the blade connector, which prevents the blade connectors from sliding through corresponding openings in meter socket adapter housing 452. The blade connectors are prevented from sliding out the other way on account of a jaw connector end of each blade connector being too large to slide through the opening accommodating each blade connector. FIG. 5D also shows optional protruding alignment features 462 that can be configured to interact with corresponding features within meter socket 112 to prevent misalignment between meter socket adapter 450 and meter socket 112.

Figure 6A:
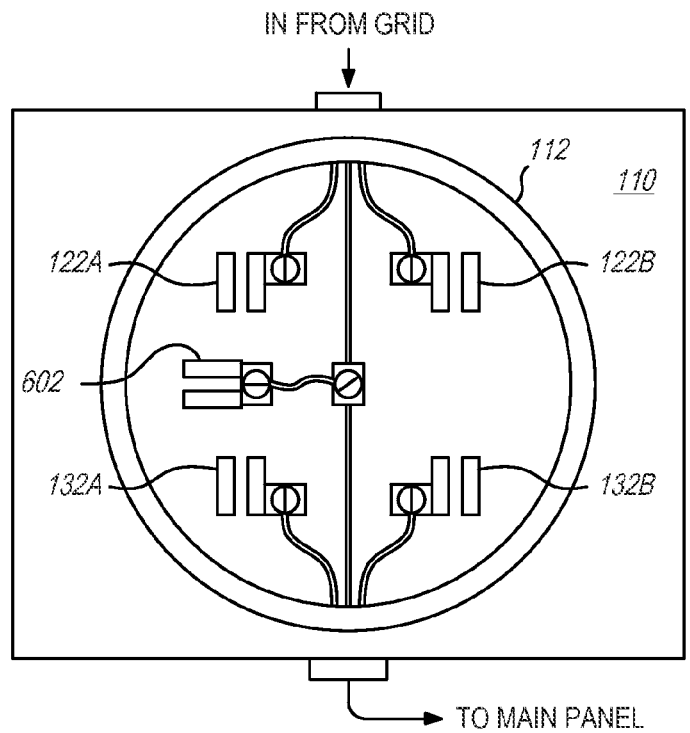
FIG. 6A shows a front view of a conventional main electrical panel meter socket adapted to work with the meter socket adapter according to various embodiments of the invention.

In order to utilize meter socket adapter 400 with a conventional main electric panel, the existing meter socket 112 will have to be modified with a jaw adapter, such as adapter 602 shown in FIG. 6A. Jaw adapter 602 is mounted within meter socket 112 providing a connector that faces outward and is orthogonal to the other jaw connectors 122A, 122B, 132A, and 132B and that is positioned at a fixed location within meter socket 112. In some embodiments, jaw adapter 602 can be positioned within meter socket 112 so that it is recessed within meter socket 112 the same amount as the other jaw connectors 122A, 122B, 132A and 132B. Jaw adapter 602 can include an electrically insulated socket base that allows jaw adapter 602 to be electrically coupled only to the neutral line bridge. As seen in the example of FIG. 6A, connector 602 provides a parallel connection to the neutral line bridge between the utility input and the output to the breaker box on customer side 115 of main electrical panel 100. In this manner, the onsite power generation system can be seamlessly, safely and inexpensively integrated into virtually any main electrical panel at a customer premises so long as it has a standard-sized meter socket and utility meter, using only two components—a meter socket with 5 connectors and a jaw adapter—without having to upgrade the customer's main utility box.

Figure 6B:
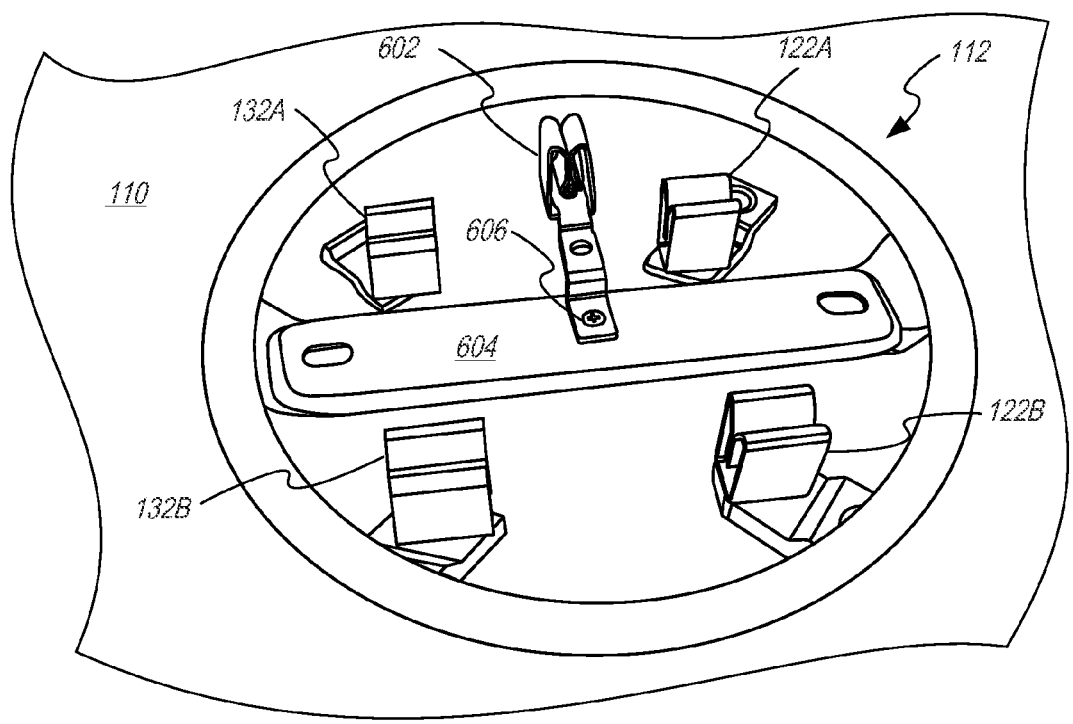
FIG. 6B shows a perspective view of an alternative electrical panel meter socket configuration.

FIG. 6B shows a perspective view of an alternative meter socket configuration. In this embodiment, jaw adapter 602 takes the form of an electrically conductive adapter that is affixed to support brace 604. Support brace 604 can be designed to provide structural support for the opening leading into meter socket 112. In this embodiment, support brace 604 also provides a platform to which jaw adapter 602 is affixed. Jaw adapter 602 can be affixed to support brace 604 in many ways. In some embodiments, jaw adapter 602 can be secured to support brace 604 by a fastener 606 that engages an opening (not depicted) defined by support brace 604. However, it should be noted that jaw adapter 602 can also be welded to support brace 604 or affixed to support brace 604 in any way that results in a solid electrical coupling between jaw adapter 602 and support brace 604. By routing the neutral signal through support brace 604, which is in turn electrically coupled with utility side 110 of electrical panel 100, electricity entering electrical panel 100 from a photovoltaic cell array can be grounded through electrical panel 100. In many embodiments, electrical panel 100 can be grounded to a metallic stake for additional electrical protection. In some cases, support brace 604 can be referred to as a neutral bridge as it provides a pathway for receiving and distributing the neutral signal from both the upstream power supply and the photovoltaic power supply.

It should be noted that, in addition to the ways depicted in FIGS. 6A and 6B, the fifth jaw can be added to the meter socket in any number of ways and that the depicted embodiments should not be construed as limiting. In some embodiments, the fifth jaw can be pre-installed at the factory and be configured to work with a meter socket adapter having a fifth jaw connector without modification.

Figure 7:
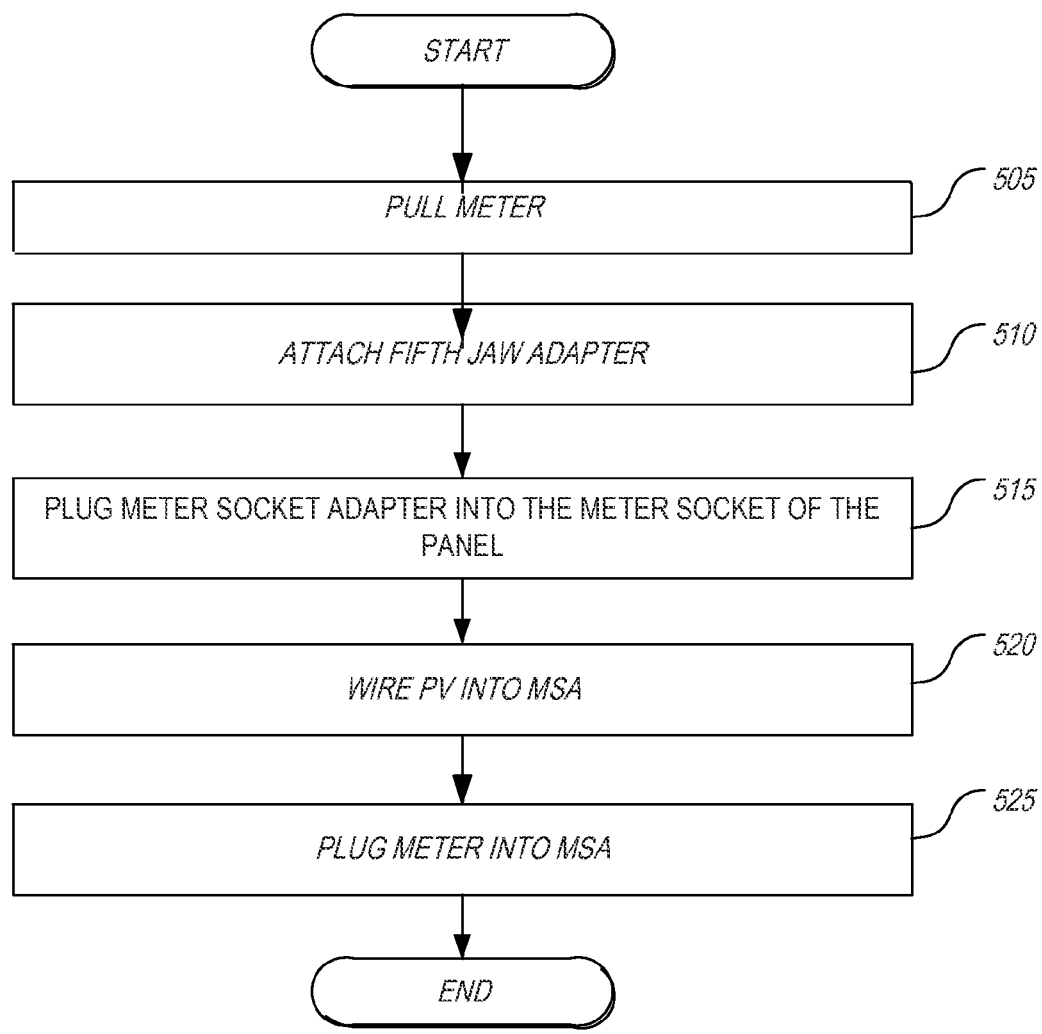
FIG. 7 is a flow chart detailing steps of a method for interfacing an onsite power generation system to an existing main electrical panel according to various embodiments of the invention.

FIG. 7 is a flow chart detailing the steps of a method for interfacing an onsite power generation system to an existing customer premises' main electrical panel according to various embodiments of the invention. The method begins in step 505 where the existing utility meter is pulled out of the meter socket in the main electrical panel. As discussed herein, this may involve removing a lock or other mechanism intended to prevent tampering with the electric meter. Local code and/or the owner of the utility meter may also require shut-off of all electric power by the utility while this is performed. Next, in step 510, a jaw adapter, such as jaw adapter 602 shown in FIGS. 6A and 6B, is installed in the existing meter socket. Jaw adapter 602 can be mechanically connected to the meter socket and will be electrically coupled to the neutral terminal bridging the utility side neutral with the neutral running to the breaker panel on the customer side of the main electrical panel. This may be done on the left or right side or even at some other position, depending on the desired mating location with the blade of the meter socket adapter.

Next, in step 515, the meter socket adapter with five blade connectors is plugged into the meter socket so that the fifth blade on the backside of the meter socket adapter mates with the fifth jaw in the meter socket. Then, in step 520, the wires from the onsite energy generation system (e.g., PV system) are wired into the meter socket adapter. In various embodiments, this will involve physically coupling a section of conduit containing the conductors from the onsite energy generation system using a connector (e.g., snap-in connector, threaded connector, etc.) into a wall of the meter socket adapter and connecting the free ends of the conductors to respective terminals in the meter socket adapter creating a parallel tap to each conductor in the meter socket on the load side as well as wiring the ground wire to the adapter.

It should be appreciated that in various embodiments, the order of steps 515 and 520 may be reversed. That is, it may be desirable to fully wire the onsite power generation system to the meter socket adapter first (AC 1, AC 2, neutral, and ground), before plugging it into the meter socket. This may be safer and easier than doing it after the meter socket adapter has been plugged into the meter, in particular, because some manipulation of the meter socket may be required to mechanically attach the conduit containing the conductors to the meter socket adapter.

Finally, in step 525, after the meter socket adapter is fully wired and plugged into the existing meter socket, the utility meter is plugged into the meter socket. Once utility power is restored, the meter will operate as if the meter socket adapter is not present, with the exception that when the onsite power generation system is producing excess power (power that is not being consumed by loads attached to the main electrical power), the parallel tap on the load side facilitated by the meter socket adapter will allow power to backflow through the meter to the grid, either slowing the rate at which the meter is incrementing or causing it to increment backwards.

Also, in various embodiments, it may be desirable to wire the onsite power generation system to the meter socket adapter first (step 520), before the meter is even pulled (step 505) in order to minimize the time that utility power must be turned off. In that case, after step 520 is performed, the meter will be pulled (step 505), the fifth jaw adapter will be installed in the socket (510), the meter socket adapter will be plugged into the socket (515) and the meter will be plugged into the meter socket adapter (525).

The embodiments of the present inventions are not to be limited in scope by the specific embodiments described herein. For example, although many of the embodiments disclosed herein have been described with reference to interfacing a photovoltaic system with an existing main electrical panel, the principles herein are equally applicable to other types of onsite power generation systems (e.g., wind). Indeed, various modifications of the embodiments of the present inventions, in addition to those described herein, will be apparent to those of ordinary skill in the art from the foregoing description and accompanying drawings. Thus, such modifications are intended to fall within the scope of the following appended claims. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, the claims set forth below should be construed in view of the full breath and spirit of the embodiments of the present inventions as disclosed herein.

What is claimed is:

1. A meter socket adapter for interfacing an onsite power generation system with an electrical service panel, the meter socket adapter comprising:
    a cylindrical body having a first end and a second end;
    an opening defined by a lateral wall of the cylindrical body;
    a set of four blade connectors on the first end of the cylindrical body positioned to connect to four jaw connectors in a meter socket of the electrical service panel, wherein two of the blade connectors are electrically coupled to supply terminals for wiring two respective AC supply lines from the onsite power generation system entering the meter socket adapter by way of the opening;
    a corresponding set of four jaw connectors on the second end of the cylindrical body, electrically coupled to the respective four blade connectors on the first end, positioned to mate with four additional blade connectors of a utility meter;
    a neutral terminal for attaching a neutral wire from the onsite power generation system; and
    a fifth blade connector electrically coupled to the neutral terminal and disposed on the first end of the cylindrical body for electrically coupling the neutral wire of the onsite power generation system to a neutral jaw connector in the meter socket at the same time that the four blade connectors mate with the four jaw connectors in the meter socket.

2. The meter socket adapter of claim 1, wherein the onsite power generation system comprises a photovoltaic array.

3. The meter socket adapter of claim 1, wherein the two AC supply lines comprise AC phase 1 and AC phase 2 respectively.

4. The meter socket adapter of claim 1, wherein the four blade connectors of the meter socket adapter are arranged in a symmetric configuration.

5. The meter socket adapter of claim 4, wherein the fifth blade connector is arranged orthogonally with respect to the set of four blade connectors.

6. The meter socket adapter of claim 1, wherein the cylindrical body defines multiple openings configured to accommodate the fifth blade connector.

7. The meter socket adapter of claim 1, wherein the first end of the cylindrical body has a size and shape in accordance with the standard meter socket.

8. A method of interfacing an onsite power generation system to an existing electrical service panel via a meter socket adapter, the method comprising:
    removing a utility meter from a meter socket of the existing electrical service panel to expose a meter socket;
    electrically coupling a fifth jaw connector to a neutral wire terminal inside the meter socket;
    connecting at least two AC power supply lines from an onsite power generation system to respective first and second load side terminals of the meter socket adapter by way of an opening in a side wall of the meter socket adapter;
    connecting a neutral wire from the onsite power generation system to a neutral terminal in the meter socket adapter via the opening in the side wall of the meter socket adapter, wherein the neutral terminal is electrically connected to a neutral blade connector of the meter socket adapter;
    plugging a first side of the meter socket adapter into the meter socket so that first and second supply side blade connectors of the meter socket adapter are connected to respective first and second supply side jaw connectors of the meter socket, and first and second load side blade connectors of the meter socket adapter are connected to respective first and second load side jaw connectors of the meter socket, and the neutral blade connector is connected to the fifth jaw connector; and
    connecting the utility meter to an opening in a second side of the meter socket adapter.

9. The method of claim 8, wherein the onsite power generation system comprises a photovoltaic array.

10. The method of claim 8, wherein the at least two AC supply lines comprise AC phase 1 and AC phase 2 respectively.

11. The method of claim 8, wherein the fifth jaw connector is oriented orthogonally with respect to each of the first and second supply side jaw connectors and first and second load side jaw connectors.

12. The method of claim 8, wherein connecting the utility meter to an opening in a second side of the meter socket adapter comprises engaging blade connectors of the meter with jaw connectors arranged along the second side of the meter socket adapter.

13. A meter socket adapter, comprising:
    a cylindrical housing, comprising:
        a first wall defining a plurality of connector openings, the first wall including a first surface arranged along an exterior of the cylindrical housing and a second surface defining an interior volume of the cylindrical housing, and
        a second wall having a curved geometry and defining a wiring port;
        a plurality of connectors extending through the connector openings defined by the first wall of the cylindrical housing, each of the connectors comprising:
            a blade connector protruding from the first surface, and
a jaw connector protruding from the second surface; and
a plurality of terminals positioned within the interior volume and being configured to connect wires passing through the wiring port to corresponding ones of the plurality of connectors, wherein one of the terminals is configured to connect to a neutral wire; wherein
one of the plurality of connectors is configured to be coupled with a jaw adapter installed within a meter socket of an electrical panel.

14. The meter socket adapter of claim 13, wherein the first wall of the cylindrical housing defines two openings for accommodating a connector configured to engage a neutral jaw connector in a meter socket, wherein moving the connector between the two openings allows the meter socket adapter to be installed in the meter socket in two different orientations.

15. The meter socket adapter of claim 13, further comprising a plurality of clips that keep corresponding connectors secured within the connector openings.

16. The meter socket adapter of claim 13, wherein the plurality of connectors comprises five connectors.

17. The meter socket adapter of claim 13, wherein the jaw connectors are configured to be coupled with blade connectors of an electric meter.

18. The meter socket adapter of claim 13, wherein the blade connectors protruding from the first surface are configured to be coupled with jaw connectors of a meter socket of an electrical panel.

\* \* \* \* \*